United States Patent [19]

Abdi

[11] Patent Number: 5,120,995
[45] Date of Patent: Jun. 9, 1992

[54] SWITCHED PEAK DETECTOR

[75] Inventor: Behrooz Abdi, Chandler, Ariz.

[73] Assignee: Motorola, Inc., Schaumburg, Ill.

[21] Appl. No.: 706,702

[22] Filed: May 29, 1991

[51] Int. Cl.⁵ .......................................... H03K 5/153
[52] U.S. Cl. .................................... 307/351; 307/546; 328/150
[58] Field of Search .................. 307/351, 352, 350; 328/150, 151, 353

[56] References Cited

U.S. PATENT DOCUMENTS

| | | | |
|---|---|---|---|
| 3,686,577 | 8/1972 | Fruhauf | 307/353 |
| 4,053,799 | 10/1977 | Minami | 307/351 |
| 4,302,689 | 11/1981 | Brodie | 307/353 |
| 4,400,633 | 8/1983 | Mouri | 307/351 |
| 4,445,093 | 4/1984 | Kohler | 307/351 |
| 4,651,034 | 3/1987 | Sato | 307/352 |
| 4,866,301 | 9/1989 | Smith | 307/351 |
| 4,987,323 | 1/1991 | Fujita | 307/351 |
| 4,996,448 | 2/1991 | Abdi | 307/359 |
| 5,025,176 | 6/1991 | Takeno | 307/351 |

OTHER PUBLICATIONS

Stephan Hayes, "Video Detector Stores Peak for Minutes", Feb. 19, 1976, pp. 112–113.
Bob Marshall, "Peak Detector Monitors Its ac Input, dc Output; Resets Automatically" Nov. 22, 1979, p. 212.

*Primary Examiner*—Stanley D. Miller
*Assistant Examiner*—Sinh Tran
*Attorney, Agent, or Firm*—Bradley J. Botsch

[57] ABSTRACT

A peak detector circuit includes a switch for charging and discharging a capacitor at predetermined rates. In a first mode of operation, the switch is open and the peak detector functions to provide an output voltage that is indicative of the peak voltage level occurring at its input by charging a capacitor at a first predetermined rate. In a second mode of operation, the switch is closed and the peak detector functions to discharge the capacitor at a second predetermined rate and to a predetermined voltage. Subsequently in the second mode of operation, the peak detector then functions to provide an output voltage that follows its input voltage.

6 Claims, 2 Drawing Sheets

SWITCHED PEAK DETECTOR

BACKGROUND OF THE INVENTION

The present invention relates to circuits such as a peak detector circuit for detecting the peak level of an input signal.

The basic theory of a peak detector is to compare the input voltage level to the output voltage level to determine if the input signal has reached a new peak voltage level. If indeed the input signal has reached a new peak, the peak detector will respond in a manner to increase the voltage level of the output signal until it has attained the same voltage of the peak input signal. A common technique used by typical peak detectors is to charge up a capacitor such that the voltage across the capacitor is indicative of the peak voltage level of the input signal. Further, when the input voltage falls below the output voltage, the capacitor maintains the peak input voltage level at the output of the peak detector until a new voltage peak appears on the input signal whereby the capacitor is then charged to a higher voltage which is indicative of the new voltage peak occurring on the input signal.

Typical peak detectors charge the voltage across the capacitor, representing the peak level of an input signal, at uncontrolled rates. However, it may be desirable to charge the capacitor at a predetermined rate. Further, the output of typical peak detectors holds the peak voltage level occurring on the input signal until a new peak voltage appears. However, in some applications, it may be desirable to discharge the voltage across the capacitor so that a new lower peak level may be acquired within a new time interval.

Hence, what is needed is a peak detector that charges and discharges a capacitor at predetermined rates.

SUMMARY OF THE INVENTION

Briefly, there is provided a circuit, comprising a transconductance amplifier having first and second inputs and an output, the first input being coupled to an input terminal at which an input voltage is applied, the second input being coupled to an output terminal for providing an output voltage; a capacitor having first and second terminals, the second terminal of the capacitor being coupled to a supply voltage terminal; a switching circuit for charging the capacitor at a predetermined rate when the switching circuit is in a first state and when the input voltage is greater than the output voltage, the switching circuit discharging the capacitor at a predetermined rate and to a predetermined voltage when the switching circuit is in a second state and when the input voltage is less than the output voltage, the output voltage following the input voltage when the capacitor has discharged to the predetermined voltage and when the switching circuit is in the second state, the switching circuit being coupled between the output of the transconductance amplifier and the first terminal of the capacitor, the switching circuit having an output; a buffer circuit coupled to the output of the switching circuit for transferring a voltage appearing at the output of the switching circuit to the output terminal; and a first current source coupled between the output terminal and the supply voltage terminal.

The present invention will be better understood from the following detailed description taken in conjunction with the accompanying drawings.

DETAILED DESCRIPTION OF THE DRAWINGS

Figure 1:
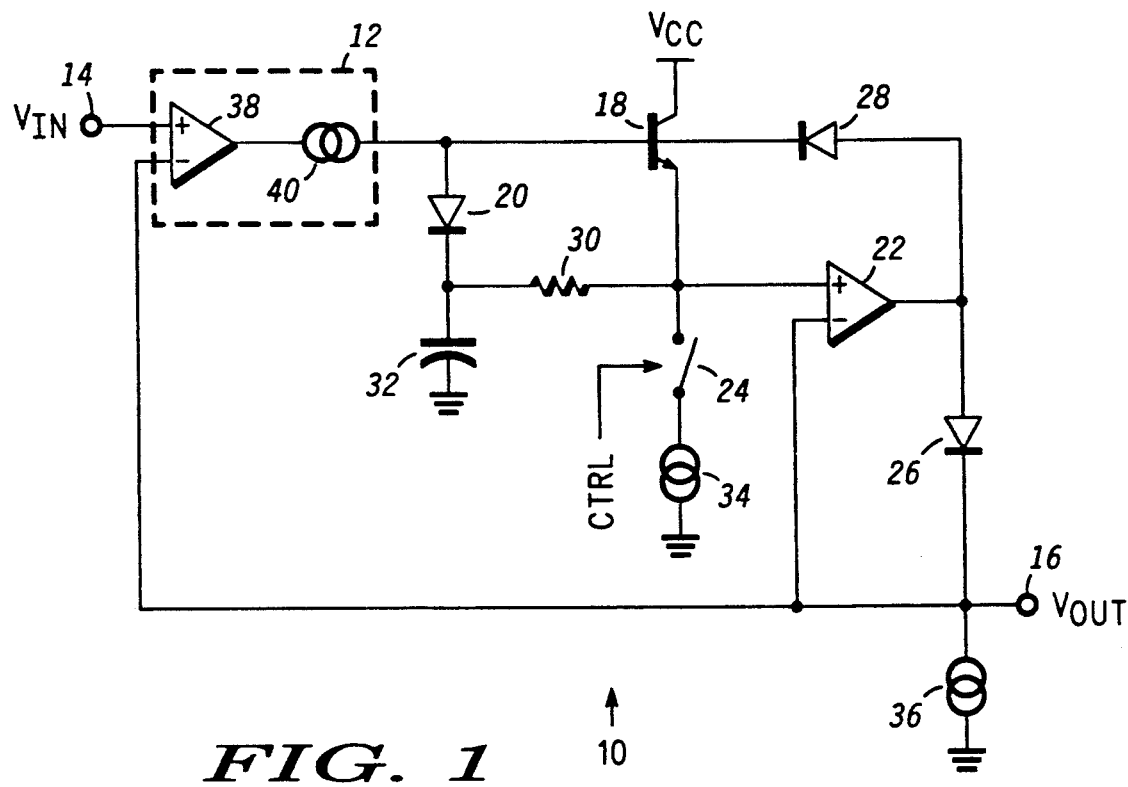
FIG. 1 is a schematic diagram illustrating a peak detector having a switch in accordance with the present invention.

Referring to FIG. 1, there is illustrated a detailed schematic diagram illustrating peak detector 10 comprising transconductance amplifier 12 having first and second input respectively coupled to input terminal 14 and output terminal 16 whereby signal $V_{IN}$ is applied to input terminal 14 and signal $V_{OUT}$ is provided at output terminal 16. The output of transconductance amplifier 12 is coupled to the base of transistor 18 and to the anode of diode 20.

Transistor 18 has a collector coupled to operating potential $V_{CC}$ and an emitter coupled to a first input of amplifier 22 and to a first terminal of switch 24.

The second input of amplifier 22 is coupled to output terminal 16, and the output of amplifier 22 is coupled to the anodes of diodes 26 and 28. The cathodes of diodes 26 and 28 are respectively coupled to output terminal 16 and to the base of transistor 18.

Resistor 30 is coupled between the cathode of diode 20 and the first terminal of switch 24. Capacitor 32 is coupled between the cathode of diode 20 and ground reference.

The second terminal of switch 24 is returned to ground through current source 34. The control terminal of switch 24 is coupled to receive signal CTRL. Current source 36 is coupled between terminal 16 and ground reference.

Transconductance amplifier 12 includes amplifier 38 having a non-inverting terminal coupled to terminal 14 and an inverting terminal coupled to terminal 16. The output of amplifier 38 is coupled to a first terminal of bi-directional current source 40. The second terminal of bi-directional current source 40 is coupled to the base of transistor 18.

In operation, first assume that signal CTRL is in a first logic state to ensure that switch 24 is open. Briefly, when $V_{IN} > V_{OUT}$, signifying a new peak is present at input terminal 14, peak detector 10 functions to charge capacitor 32 in order to provide an output signal at terminal 16 that represents the peak voltage level of its input signal applied at terminal 14. In addition, when $V_{IN} > V_{OUT}$, diode 28 is reversed biased.

Figure 2:
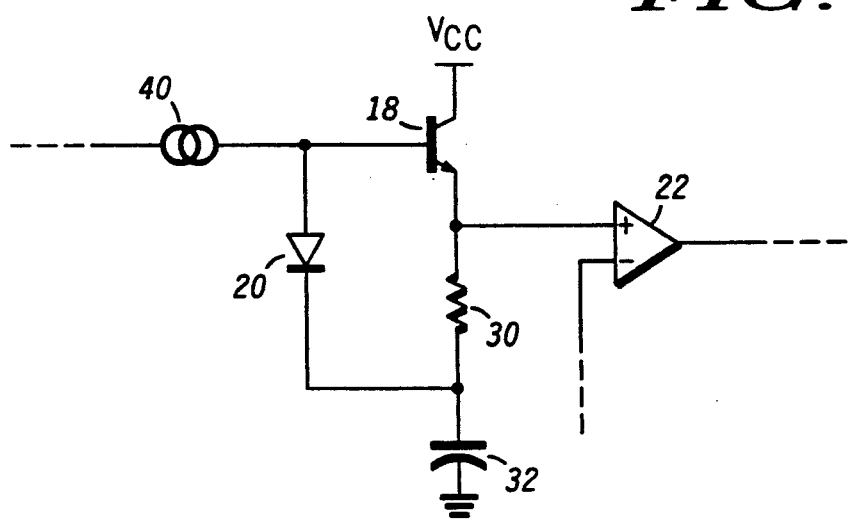
FIG. 2 is a simplified portion of the peak detector of FIG. 1 for the switch being open.

In particular, referring to FIG. 2, a simplified portion of peak detector 10 of FIG. 1 for switch 24 being open is shown. It is understood that diode 20 and transistor 18 form a current mirror such that if resistor 30 is made large, substantially zero current flows through transistor 18 and resistor 30. Thus, when $V_{IN} > V_{OUT}$, substantially all of the current supplied from current source 40 is used to charge capacitor 32. As a result, the voltage across capacitor 32 is charged by a predetermined current and at a predetermined rate as determined by the well known relationship for voltage and current through a capacitor as shown in EQN. 1.

$$t_{charge} = (C_{32} \times V_{32})/I_{40} \quad (1)$$

where
C$_{32}$ is the capacitance of capacitor 32;
I$_{40}$ is the current supplied from bi-directional current source 40;
V$_{32}$ is the delta voltage occurring across capacitor 32 due to current I$_{40}$; and
t$_{charge}$ is the charge time to change a delta voltage of V$_{32}$ across capacitor 32.

Moreover, if diode 20 is matched with transistor 18, the voltage appearing at the emitter of transistor 18 is substantially equal to the voltage appearing across capacitor 32 wherein the voltage across capacitor 32 is indicative of the peak voltage level occurring at input terminal 14.

Amplifier 22 is configured as a non-inverting buffer circuit to transform the voltage appearing at the emitter of transistor 18 (the non-inverting input of amplifier 22) to output terminal 16.

In summary, when switch 24 is open and V$_{IN}$>V$_{OUT}$, peak detector 10 operates in a peak detection mode to provide an output signal at terminal 16 which is indicative of the peak voltage occurring at terminal 14.

On the other hand, when switch 24 is open and voltage V$_{IN}$ falls below voltage V$_{OUT}$, signifying that a new peak is not occurring at input terminal 14, capacitor 32 maintains its charged voltage level. Thus, the voltage at terminal 16 is held at the previous peak voltage level that appeared at terminal 14. In addition, when V$_{IN}$<V$_{OUT}$, diode 28 is forward biased and diodes 26 and 28 clamp the voltage at the base of transistor 18 to a voltage substantially equal to the voltage appearing at terminal 16. This is easily seen since the voltage at the output of amplifier 22 is one diode voltage above the voltage at output terminal 16 while the voltage at the base of transistor 18, when diode 28 is on, will be one diode voltage below the voltage at the output of amplifier 22. This voltage clamping can also be utilized to keep transconductance amplifier 12 in the linear mode of operation.

Now assume that signal CTRL is in a second logic state to ensure that switch 24 is closed. Further, assume that V$_{IN}$<V$_{OUT}$ upon closing switch 24. Briefly, in this mode, peak detector 10 initially functions to discharge capacitor 32 via current source 34 to a predetermined voltage. Furthermore, once capacitor 32 has been discharged, peak detector 10 subsequently functions as a buffer to provide an output voltage at terminal 16 that follows input voltage applied to terminal 14.

Figure 3:
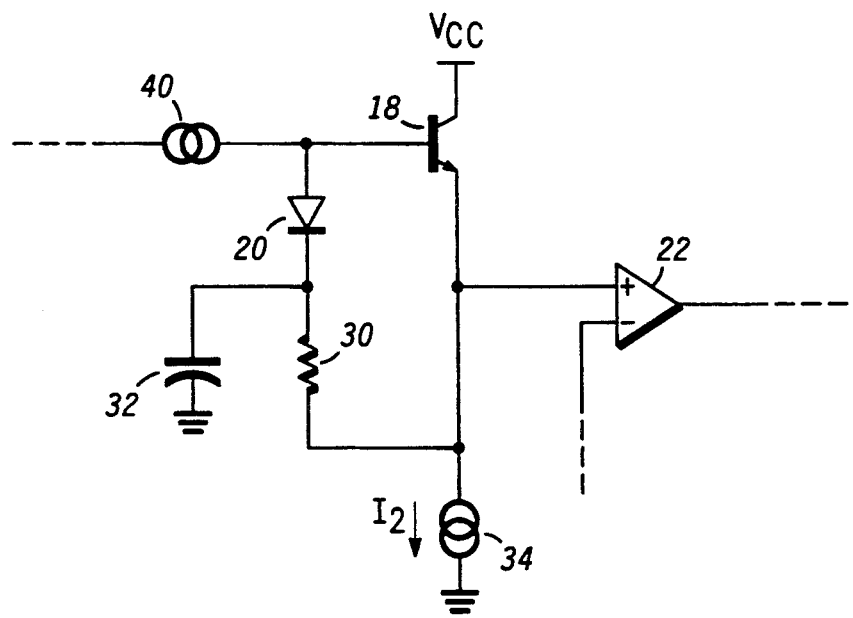
FIG. 3 is a simplified portion of the peak detector of FIG. 1 for the switch being closed.

In particular, referring to FIG. 3, a simplified portion of peak detector 10 of FIG. 1 for switch 24 being closed is shown. For voltage V$_{IN}$<V$_{OUT}$, current I$_2$ will be used to discharge capacitor 32 at a predetermined rate. Subsequently, when the voltage across capacitor 32 has discharged and decreased to a predetermined voltage, for example, one diode voltage drop below voltage V$_{IN}$, transistor 18 is rendered operative. As a result, due to resistor 30 being large and to the current mirror relationship between diode 20 and transistor 18 as aforementioned, substantially all of current I$_2$ flows through transistor 18 while substantially zero current flows through diode 20. This allows the voltage across capacitor 32 to remain substantially one diode voltage drop below voltage V$_{OUT}$. Further, it is understood that the current through bi-directional current source 40 is flowing into amplifier 38 via diode 28 which is forward biased since V$_{IN}$<V$_{OUT}$.

As aforedescribed, if diode 20 and transistor 18 are matched, the voltage at the emitter of transistor 18 is substantially equal to the voltage across capacitor 32. Moreover, this voltage is transferred through amplifier 22 to output terminal 16.

Once transistor 18 is rendered operative by capacitor 32 discharging to the predetermined voltage and if switch 24 remains closed, then the voltage at the emitter of transistor 18 will follow the input voltage appearing at terminal 14 since as voltage V$_{IN}$ changes, the voltage at the base of transistor 18 correspondingly changes. In addition, the voltage at the emitter of transistor 18 is transferred to output terminal 16 via amplifier 22. Thus, peak detector 10 functions as a buffer circuit to provide an output voltage at terminal 16 (V$_{OUT}$) that follows the input voltage at terminal 14 (V$_{IN}$). Further, bi-directional current source 40 provides a current that is substantially equal to the base current of transistor 18.

In summary, when switch 24 is closed and V$_{IN}$<V$_{OUT}$, peak detector 10 operates to first discharge capacitor 32 to a predetermined voltage. Once this predetermined voltage is obtained across capacitor 32, peak detector 10 then functions as a buffer circuit such that voltage appearing at output terminal 16 follows the voltage occurring at input terminal 14. That is, voltage V$_{OUT}$ follows voltage V$_{IN}$.

Figure 4:
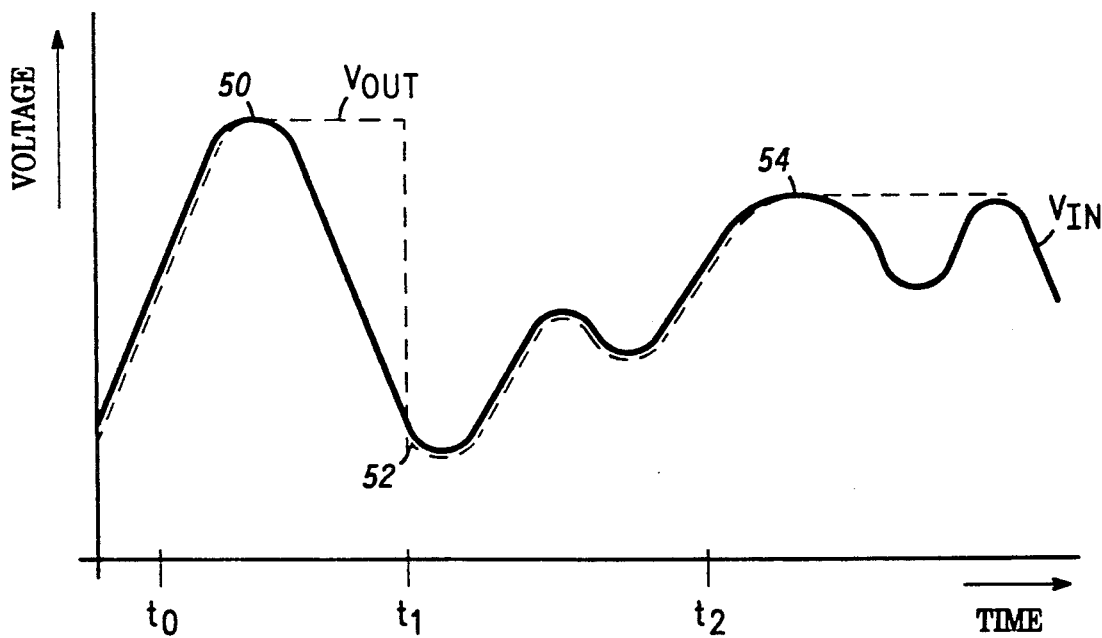
FIG. 4 is a graphical illustration of an output signal vs. an input signal of the peak detector of FIG. 1.

Referring to FIG. 4, a graphical illustration of an output signal vs. an input signal of peak detector 10 of FIG. 1. is shown. From time interval t$_0$ to t$_1$, switch 24 is open and peak detector 10 acquires the peak voltage level occurring at input terminal 14 via voltage V$_{IN}$, and maintains this peak voltage which is provided at terminal 16 via voltage V$_{OUT}$. In particular, voltage V$_{OUT}$ will increase to peak input voltage level 50 and hold this voltage as long as switch 24 is open.

However, at time t$_1$, switch 24 is closed. Therefore, from time interval t$_1$ to t$_2$, peak detector 10 first decreases voltage V$_{OUT}$ to a voltage (denoted by 52) of voltage V$_{OUT}$ by discharging capacitor 32 (FIG. 1). Subsequently, peak detector 10 then functions as a buffer to allow voltage V$_{OUT}$ to follow voltage V$_{IN}$ as long as switch 24 remains closed.

At time t$_2$, switch 24 is opened again, and peak detector 10 then returns to its peak detection mode and acquires peak input voltage level 54.

It should be apparent that by discharging capacitor 32, new lower input voltage peak levels can be acquired. For example, if capacitor 32 could not be discharged, then peak 54 of FIG. 4 would not have been acquired since peak 54 is lower than previous peak 50. This may be useful in disk drive applications where local peaks are desired to be found.

By now it should be appreciated that there has been provided a novel peak detector that charges and discharges a capacitor at predetermined rates.

While the invention has been described in conjunction with specific embodiments thereof, it is evident that many alterations, modifications and variations will be apparent to those skilled in the art in light of the foregoing description. Accordingly, it is intended to embrace all such alterations, modifications and variations in the appended claims.

What is claimed is:
1. A circuit, comprising:

a transconductance amplifier having first and second inputs and an output, said first input being coupled to an input terminal at which an input voltage is applied, said second input being coupled to an output terminal of the circuit for providing an output voltage;

a capacitor having first and second terminals, said second terminal of said capacitor being coupled to a supply voltage terminal;

switching means responsive to a control signal and coupled between said output of said transconductance amplifier and said first terminal of said capacitor, when said control signal is in a first logic state said switching means charging said capacitor at a predetermined rate when said input voltage is greater than said output voltage such that said output voltage is indicative of a peak voltage appearing at said input terminal, when said control signal is in a second logic state said switching means discharging said capacitor at a predetermined rate and to a predetermined voltage when said input voltage is less than said output voltage such that said output voltage follows said input voltage when said capacitor has discharged to said predetermined voltage buffer means having an input and an output, said input of said buffer means being coupled to said output of said switching means, said output of said buffer means being coupled to said output terminal of the circuit, said buffer means transferring a voltage appearing at said output of said switching means to said output terminal of the circuit; and clamping means coupled between said output of said transconductance amplifier and said output terminal of the circuit for clamping said output of said transconductance amplifier to said output voltage when said input voltage is less than than said output voltage.

2. The circuit according to claim 1 wherein said switching means includes:

a transistor having a collector, a base and an emitter, said collector being coupled to an additional supply voltage terminal, and said base being coupled to said output of said transconductance amplifier;

a first diode coupled between said output of said transconductance amplifier and said first terminal of said capacitor;

a resistor coupled between said first terminal of said capacitor and said emitter of said transistor;

a switch having first, second and control terminals, said first terminal of said switch being coupled to emitter of said transistor and said output of said switching means, and said control terminal of said switch being coupled to receive a control signal; and a first current source coupled between said second terminal of said switch and said supply voltage terminal.

3. The circuit according to claim 2 wherein said transconductance amplifier includes:

an operational amplifier having non-inverting and inverting inputs and an output, said non-inverting input being coupled to said first input of said transconductance amplifier, and said inverting input being coupled to said second input of said transconductance amplifier; and a bi-directional current source coupled between said output of said operational amplifier and said output of said transconductance amplifier.

4. The circuit according to claim 3 further includes a second current source coupled between said output terminal of the circuit and said supply voltage terminal.

5. The circuit according to claim 3 wherein said clamping means includes:

a second diode having an anode and a cathode, said anode of said second diode being coupled to said output of said buffer means, and said cathode of said second diode being coupled to said output terminal of the circuit; and a third diode having an anode and a cathode, said anode of said third diode being coupled to said output of said buffer means, and said cathode of said third diode being coupled to said output of said transconductance amplifier.

6. A switched peak detector circuit having an input terminal and output terminal, comprising:

a transconductance amplifier having first and second inputs and an output, said first input of said transconductance amplifier being coupled to the input terminal at which an input voltage is applied, said second input of said transconductance amplifier being coupled to the output terminal for providing an output voltage;

a capacitor having first and second terminals, said second terminal of said capacitor being coupled to a first supply voltage terminal;

a switch having first, second and control terminals, said control terminal being coupled to receive a control signal;

a first diode having an anode and a cathode, said anode of said first diode being coupled to said output of said transconductance amplifier, said cathode of said first diode being coupled to said first terminal of said capacitor.

a transistor having a collector, a base and an emitter, said collector being coupled to a second supply voltage terminal, said base being coupled to said output of said transconductance amplifier, and said emitter being coupled to said first terminal of said switch;

a resistor coupled between said first terminal of said capacitor and said emitter of said transistor;

a current source coupled between said second terminal of said switch and said first supply voltage terminal;

a buffer circuit having first and second inputs and an output, said first input of said buffer circuit being coupled to said first terminal of said switch, said second input of said buffer circuit being coupled to the output terminal;

a second diode having an anode and a cathode, said anode of said second diode being coupled to said output of said buffer circuit, and said cathode of said second diode being coupled to said output terminal; and a third diode having an anode and a cathode, said anode of said third diode being coupled to said output of said buffer circuit, and said cathode of said third diode being coupled to said output of said transconductance amplifier.

* * * * *